United States Patent
Cho et al.

(10) Patent No.: US 7,764,543 B2
(45) Date of Patent: Jul. 27, 2010

(54) MEMORY DEVICE AND METHOD OF READING MEMORY DATA

(75) Inventors: Kyoung Lae Cho, Yongin-si (KR); Dong Hun Yu, Seoul (KR); Jun Jin Kong, Yongin-si (KR); Seung-Hwan Song, Incheon (KR); Yoon Dong Park, Yongin-si (KR); Jong Han Kim, Suwon-si (KR); Young Hwan Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 178 days.

(21) Appl. No.: 12/219,264

(22) Filed: Jul. 18, 2008

(65) Prior Publication Data
US 2009/0190396 A1  Jul. 30, 2009

(30) Foreign Application Priority Data
Jan. 29, 2008  (KR) .................. 10-2008-0009218

(51) Int. Cl.
  *G11C 16/00* (2006.01)
(52) U.S. Cl. .................... 365/185.03; 365/185.24
(58) Field of Classification Search ............. 365/168
  See application file for complete search history.

(56) References Cited

U.S. PATENT DOCUMENTS

| 6,707,713 | B1 * | 3/2004 | Parker et al. | 365/185.03 |
| 7,313,020 | B2 * | 12/2007 | Chae et al. | 365/185.03 |

FOREIGN PATENT DOCUMENTS

| JP | 10-011983 | 1/1998 |
| JP | 11-185484 | 7/1999 |
| KR | 10-2007-0077273 | 8/2001 |
| KR | 10-2002-0057055 | 7/2002 |
| KR | 10-2005-0007653 | 1/2005 |
| KR | 10-2007-0023970 | 3/2007 |

* cited by examiner

*Primary Examiner*—Tan T. Nguyen
(74) *Attorney, Agent, or Firm*—Harness, Dickey & Pierce, P.L.C.

(57) ABSTRACT

A memory device and a method of reading multi-bit data stored in a multi-bit cell array may be provided. The memory device may include a multi-bit cell array including a least one memory page with each memory page having a plurality of multi-bit cells, and a determination unit to divide the plurality of multi-bit cells into a first group and second group. The first group may include multi-bit cells with a threshold voltage higher than a reference voltage. The second group may include multi-bit cells with a threshold voltage lower than the reference voltage. The determination unit may sequentially update the first group and second group while changing the reference voltage.

19 Claims, 8 Drawing Sheets

MEMORY DEVICE AND METHOD OF READING MEMORY DATA

PRIORITY STATEMENT

This application claims priority from Korean Patent Application No. 10-2008-0009218, filed on Jan. 29, 2008, in the Korean Intellectual Property Office (KIPO), the entire contents of which is incorporated herein by reference.

BACKGROUND

1. Field

Example embodiments may relate to a method of reading data in a memory device. Also, example embodiments may relate to a method and apparatus for reading data in a multi-level cell (MLC) or multi-bit cell (MBC) memory device.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. Due to a fine electrical characteristic difference between SLC memories, the programmed threshold voltage level may have the distribution within a predetermined range. For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may be determined that the data stored in the memory cell has a logic value of "0". The data stored in the memory cell may be classified depending on the difference between cell currents and/or cell voltages during the reading operations.

Meanwhile, a multi-level cell (MLC) memory device that may store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To store "m" bits in a single memory cell, where "m" is an integer, $2^m$ voltage level distributions may be required. However, since the voltage window for a memory cell may be limited, the number of distributions in the limited voltage window may also increase up to $2^m$ as "m" increases. Accordingly, the difference in threshold voltage between adjacent bits may decrease and distributions may overlap. When the distributions are overlapped, the read-failure rate may increase. For this reason, it may be difficult to improve storage density using a MLC memory device.

With the current increase in the utilization of the MLC memory device, error correction codes or error control codes (ECC) that may detect an error during data storing and reading operations and correct the detected error are being more widely used.

SUMMARY

Example embodiments may provide a memory device and a method of reading data in a memory device which relate to reading data in a multi-level or multi-bit cell memory such that there may a reduction of errors when reading the data and a reduction of hardware complexity.

Example embodiments may also reduce a number of pre-chargings, and thereby may reduce a time to read the data.

According to example embodiments, a memory device may include a multi-bit cell array and a determination unit. The multi-bit cell array may include at least one memory page with each memory page including a plurality of multi-bit cells. The determination unit may divide the plurality of multi-bit cells into a first group and second group, the first group including multi-bit cells with a threshold voltage higher than a reference voltage, and the second group including multi-bit cells with a threshold voltage lower than the reference voltage. The determination unit may sequentially update the first group and second group while changing the reference voltage.

According to example embodiments, a memory device may further include a page buffer that stores data to be programmed while a program of a memory page of the multi-bit cell array is operated. The determination unit may divide the plurality of multi-bit cells of the memory page into the first group and the second group during a read operation with respect to the memory page of the multi-bit cell array. The determination unit may update the first group and second group while sequentially changing the reference voltage during the read operation. The page buffer may store a flag indicating which one of the first group and second group includes each of the multi-bit cells of the memory page.

According to example embodiments, a method of reading multi-bit data stored in a multi-bit cell array may include selecting any one of a plurality of reference voltage levels, setting the selected reference voltage level as a reference voltage, comparing the reference voltage and a threshold voltage of multi-bit cells of a memory page in the multi-bit cell array, storing information about each multi-bit cell having a threshold voltage higher than the reference voltage; and storing information about each multi-bit cell having a threshold voltage lower than the reference voltage. The selecting, setting, comparing, and storing may be repeated until all reference voltage levels are selected. The setting may select any one of remaining reference voltage levels excluding the selected reference voltage level after the comparing. The storing may set the selected reference voltage as a new reference voltage.

BRIEF DESCRIPTION

The above and/or other aspects, and advantages will become more apparent and more readily appreciated from the following detailed description of example embodiments, taken in conjunction with the accompanying drawings, in which.

DETAILED DESCRIPTION

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1:
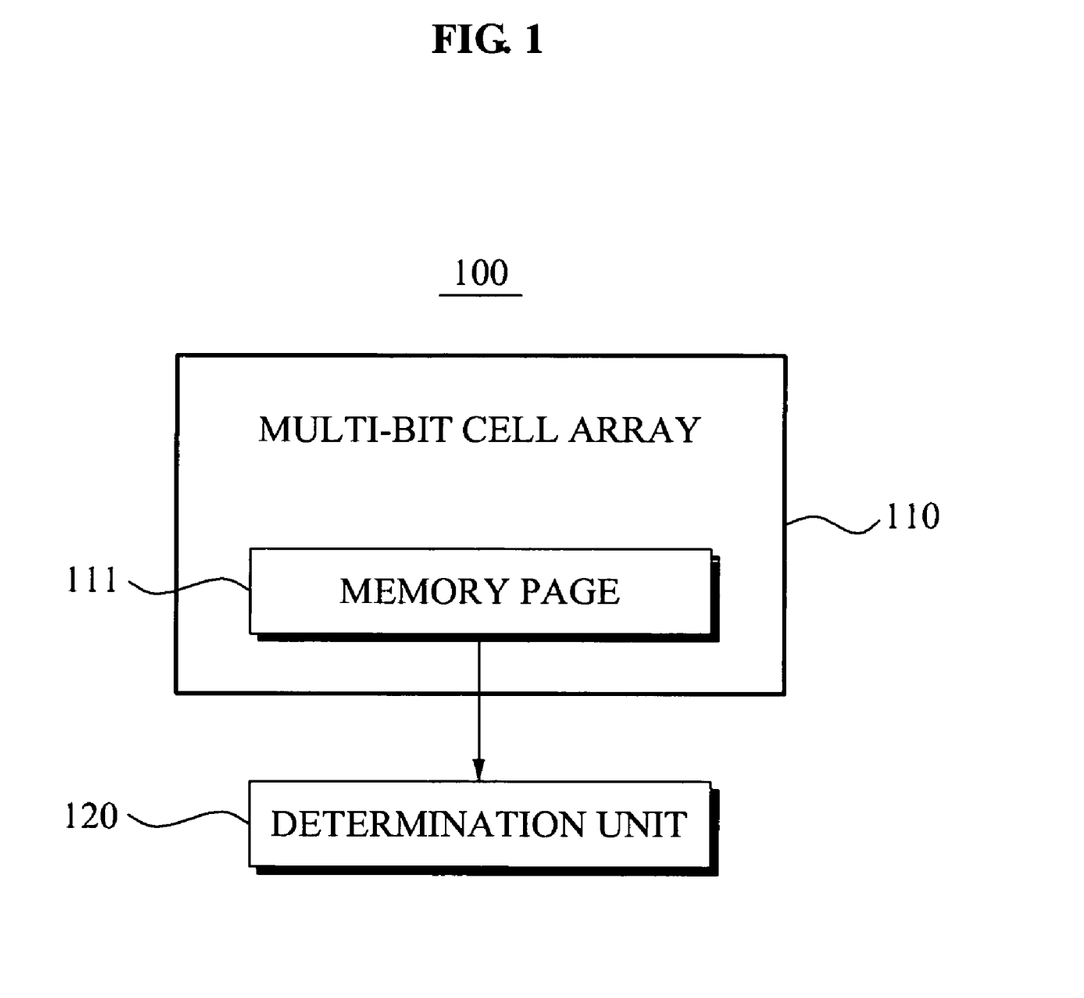
FIG. 1 is a diagram illustrating a memory device according to example embodiments.

FIG. 1 is a diagram illustrating a memory device 100 according to example embodiments.

Referring to FIG. 1, the memory device 100 includes a multi-bit cell array 110 and a determination unit 120.

The multi-bit cell array 110 may include a plurality of multi-bit cells. A single multi-bit cell may store multi-bit data. A process of storing, by the memory device 100, data in the single multi-bit cell may be referred to as "programming" and may be performed based on mechanism such as a Fowler-Nordheim (F-N) tunneling and the like.

The programming process may change the threshold voltage of the multi-bit cell. For example, when a single multi-bit cell is used to store m bits of data, one of $2^m$ threshold voltage levels may be formed in the single multi-bit cell.

Since the programming process may require a relatively longer period of time in comparison to a data reading process, the memory device 100 may simultaneously program a plurality of adjacent multi-bit cells to thereby reduce a programming time with respect to the whole multi-bit cell array. A set of the simultaneously programmed multi-bit cells may be referred to as a "memory page" 111. The memory page 111 may be a set of multi-bit cells connected to a single word line.

Where the memory page 111 may include "p" number of multi-bit cells, where "p" is an integer, and the single multi-bit cell may store m bits of data, the memory page 111 may store the product of p and m (p×m) bits of data.

The m-bit data stored in the single multi-bit cell may be arranged from a most significant bit (MSB) to a least significant bit (LSB). The memory device 100 may sequentially store at the bits in an order progressing from the MSB to the LSB. For example, the bits lower than the MSB may be used for storing only after initially storing at the MSB in the single multi-bit cell. As a result, the LSB may be stored at lastly in the multi-bit cell.

Alternatively, according to example embodiments, the memory device 100 may sequentially store at the bits in an order progressing from the LSB to the MSB. For example, the bits higher than the LSB may be used for storing only after storing at the LSB in the single multi-bit cell. As a result, the MSB may be stored at lastly in the multi-bit cell.

Also, the memory device 100 may sequentially store at bits lower than the MSB after storing at the MSB of each of the multi-bit cells in each of the multi-bit cells of the memory page 111. A set of MSBs in each of the multi-bit cells of the memory page 111 may be referred to as a data page. When the memory page 111 includes the "p" number of multi-bit cells, the data page may be p-bits in size.

The memory device 100 may store at the LSB of each of the multi-bit cells in each of the multi-bit cells of the memory page 111. A set of LSBs in each of the multi-bit cells of the memory page 111 may also be referred to as a data page.

When each of the multi-bit cells of the memory page 111 stores the m-bits of data, an "m" number of data pages may be stored in the memory page 111.

In order to store the "m" number of data pages in a single page, the memory device 100 may require "m" number of page programming operations. During each page programming operation, the memory device 100 may store one data page to the single page.

A page buffer (not illustrated in FIG. 1) may be a memory that stores m data pages during the page programming operation. Accordingly, the page buffer may not have to be a non-volatile memory. Generally, the page buffer may consist of a static random access memory (SRAM) or a memory similar thereto. The page buffer may store from at least one data page to an "m" number of data pages.

When the memory device 100 stores a first data page in the memory page 111 through a first page programming operation, each threshold voltage of the multi-bit cells of the memory page 111 may form two threshold voltage states.

For example, when the memory device 100 changes a threshold voltage of multi-bit cell storing data of "1" into 1 V, and changes a threshold voltage of multi-bit cell storing data of "0" into 2.5 V, the threshold voltage of multi-bit cell storing data of "1" may have a distribution of 0.7 V through 1.3 V, and the threshold voltage of multi-bit cell storing data of "0" may have a distribution of 2.2 V through 2.8 V since electric characteristics of multi-bit cells are slightly different from each other.

In the present specification, a distribution of a predetermined range of threshold voltages of the multi-bit cells storing data is referred to as a "distribution state" or "threshold voltage state." Since the "distribution state" or "threshold voltage state" is simply a term to simplify descriptions, example embodiments are not limited to these terms.

When the memory device 100 performs a second page programming operation after performing the first page programming operation, and stores the first data page and second data page in the memory page 111, a threshold voltage of the multi-bit cells of the memory page 111 may form four threshold voltage states.

When the multi-bit cells of the memory page 111 store the m-bit data, the threshold voltages of the multi-bit cells of the memory page 111 may form $2^m$ threshold voltage states. Since a possibility of incorrectly reading data may increase as an interval between the threshold voltage states decreases, a data page stored during a last page programming operation, for example, a data page corresponding to the LSB, may include more errors than previously stored data pages.

The determination unit 120 may divide multi-bit cells of the memory page 111 into a first group and second group. The determination unit 120 may select multi-bit cells with a threshold voltage higher than the reference voltage as the first group, and select multi-bit cells with a threshold voltage lower than the reference voltage as the second group. The determination unit 120 may sequentially update the first group and second group while changing the reference voltage.

For example, the determination unit 120 may set a first voltage level for a first period of time as the reference voltage. The determination unit 120 may select multi-bit cells with a threshold voltage higher than the first voltage level as the first group, and select multi-bit cells with a threshold voltage lower than the first voltage level as the second group. The determination unit 120 may set a second voltage level for a second period of time as the reference voltage. The determination unit 120 may then select multi-bit cells with a threshold voltage higher than the second voltage level as the first group, and select multi-bit cells with a threshold voltage lower than the second voltage level as the second group. The memory device 100 may store information about the first group and second group in the first period of time, and information about the first group and second group in the second period of time. Any multi-bit cell of the memory page 111 may be included in the first group for the first period of time, and included in the second group for the second period of time. The determination unit 120 may identify data stored in the multi-bit cell based on a history with respect to a change of a group including the multi-bit cell.

Figure 3:
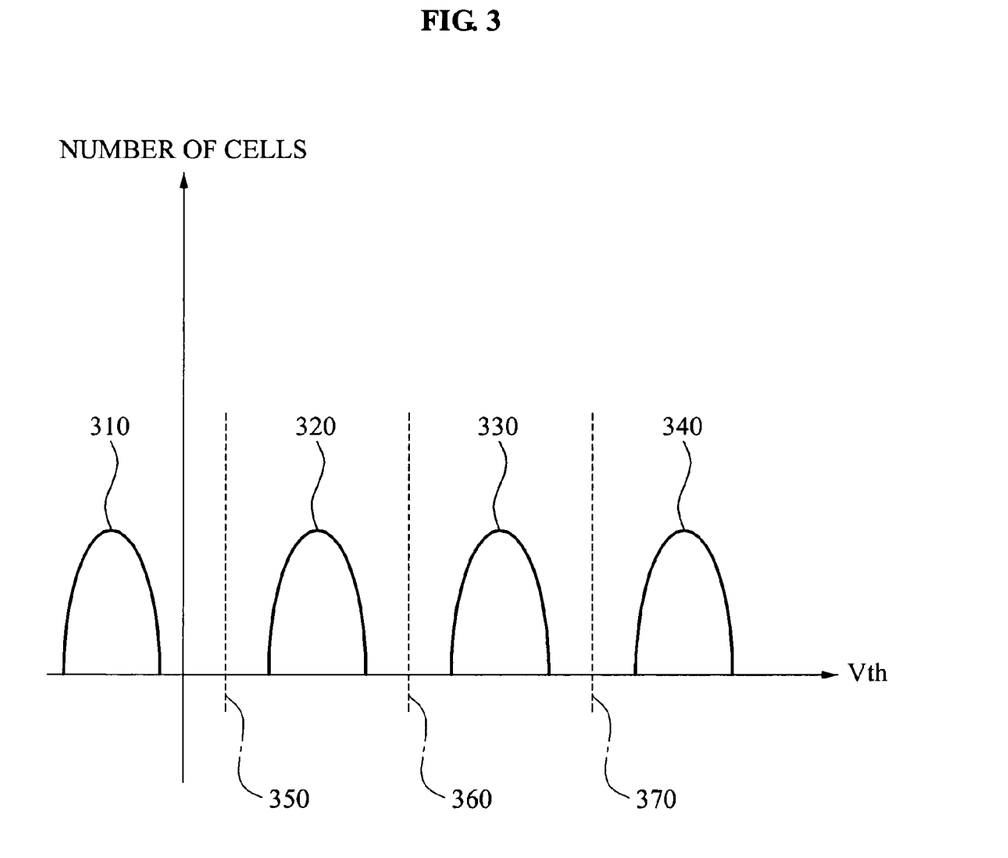
FIG. 3 is a graph illustrating an example of performances of a determination unit of FIG. 1, a determination unit of FIG. 2, and a determination unit of FIG. 6.

FIG. 3 is a graph illustrating a performance of the determination unit 120 of FIG. 1.

Referring to FIG. 3, a horizontal axis indicates the threshold voltage of multi-bit cells and a vertical axis indicates a number of multi-bit cells with a corresponding threshold voltage.

The multi-bit cells of the memory page 111 form four threshold voltage states 310, 320, 330, and 340.

The determination unit 120 may set a voltage level 370 as the reference voltage for the first period of time. The determination unit 120 may select multi-bit cells with a threshold voltage higher than the voltage level 370 as the first group. The multi-bit cells, selected as the first group for the first period of time by the determination unit 120, may have the threshold voltage state 340. The determination unit 120 may select multi-bit cells with a threshold voltage lower than the voltage level 370 as the second group. The multi-bit cells, selected as the second group for the first period of time by the determination unit 120, may have the threshold voltage state 310, threshold voltage state 320, and threshold voltage state 330.

The memory device may store information about which one of the first group or second group includes each of the multi-bit cells of the memory page 111. The memory device 100 may store the information in a page buffer. In this instance, data to be programmed may be stored in the page buffer during a programming operation. Also, the determination unit 120 may store group information corresponding to each of the multi-bit cells in the page buffer during a read operation. The group information may be information about which one of the first group and second group includes each of the multi-bit cells. The memory device 100 may transmit the group information corresponding to each of the multi-bit cells to a controller (not illustrated in FIG. 1). The group information may be stored in the page buffer for the first period of time.

According to example embodiments, the memory device 100 may transmit the group information corresponding to each of the multi-bit cells to the controller for the first period of time. The controller may store the transmitted group information in a memory (not illustrated in FIG. 1). The memory may be located in the controller.

The determination unit 120 may set a voltage level 360 as a reference voltage for the second period of time. The determination unit 120 may select multi-bit cells with a threshold voltage higher than the voltage level 360 as a first group for the second period of time. The multi-bit cells, selected as the first group for the second period of time by the determination unit 120, may be multi-bit cells with a threshold voltage state 330 and a threshold voltage state 340. The determination unit 120 may select multi-bit cells with a threshold voltage lower than the voltage level 360 as the second group for the second period of time. The multi-bit cells, selected as the second group for the second period of time by the determination unit 120, may be multi-bit cells with a threshold voltage state 310 and a threshold voltage state 320. The determination unit 120 may update the first group and second group using the reference voltage changed for the second period of time, for example, the voltage level 360. The memory device 100 may store the updated group information corresponding to each of the multi-bit cells in the page buffer for the second period of time. The memory device 100 may transmit the updated group information, stored in the page buffer for the second period of time, to the controller.

The determination unit 120 may set a voltage level 350 as a reference voltage for a third period of time. The determination unit 120 may select multi-bit cells with a threshold voltage higher than the voltage level 350 as a first group for the third period of time. The multi-bit cells, selected as the first group for the third period of time by the determination unit 120, may be multi-bit cells with the threshold voltage state 320, threshold voltage state 330, and a threshold voltage state 340. The determination unit 120 may select multi-bit cells with a threshold voltage lower than the voltage level 350 as the second group for the third period of time. The multi-bit cells, selected as the second group for the third period of time by the determination unit 120, may be multi-bit cells with the threshold voltage state 310. The determination unit 120 may update the first group and second group using the reference voltage changed for the third period of time, for example, the voltage level 350. The memory device 100 may store the updated group information corresponding to each of the multi-bit cells in the page buffer for the third period of time. The memory device 100 may transmit the updated group information, stored in the page buffer for the third period of time, to the controller.

According to example embodiments, the memory device 100 may transmit the group information corresponding to each of the multi-bit cells to the controller for the first period of time, transmit the updated group information corresponding to each of the multi-bit cells to the controller for the second period of time, and transmit the updated group information corresponding to each of the multi-bit cells for the third period of time to the controller. The group information may be determined by the determination unit 120. The controller may identify data stored in each of the multi-bit cells from the transmitted group information.

The determination unit 120 may identify that data, stored in the multi-bit cells selected as the first group for the first period of time, is "01." The first group of the first period of time may be the multi-bit cells with the threshold voltage state 340, and thus the threshold voltage state 340 may correspond to the data of "01."

The determination unit 120 may identify that data, stored in the multi-bit cells selected as the second group for the first period of time and the first group for the second period of time, is "00." The first group of the second period of time may be the multi-bit cells with the threshold voltage state 330 and threshold voltage state 340. However, the threshold voltage state 340 may correspond to the data of "01" and belong to the first group for the first period of time. So the remaining multi-bit cells may only have the threshold voltage state 330. Also, data stored in remaining multi-bit cells may be identified as "00." Thus, the threshold voltage state 330 may correspond to the data of "00."

The determination unit 120 may identify data, stored in the multi-bit cells selected as the second group for the second period of time and as the first group for the third period of time, is "10." The second group for the second period of time may be the multi-bit cells with the threshold voltage state 310 and the threshold voltage state 320. The multi-bit cells, selected as the first group for the third period of time, may be the multi-bit cells with the threshold voltage state 320, threshold voltage state 330, and threshold voltage state 340. However, the threshold voltage state 330 may correspond to the data of "00" and the threshold voltage state 340 may correspond to the data of "01." Moreover, the threshold voltage states 330 and 340 may correspond to the first group for the second period of time. So the remaining multi-bit cells may only have the threshold voltage state 320. Also, data stored in remaining multi-bit cells may be identified as "10." Thus, the threshold voltage state 320 may correspond to the data of "10."

The determination unit 120 may identify the remaining data as "11". Thus, the data may be stored in multi-bit cells of the second group for the third period of time, which may correspond to the threshold voltage state 310. Thus, the threshold voltage state 310 may correspond to the data of "11."

In example embodiments, the determination unit 120 may set the reference voltage for the first period of time as a first reference voltage level, for example, the voltage level 370, and divide the first group and second group. Then, the determination unit 120 may reset the reference voltage as the voltage level 360, which may be lower than the first reference voltage level, for the second period of time, and update the first group and second group. The reference voltage levels may be the previously defined plurality of voltage levels, for example, the voltage level 350, voltage level 360, and voltage level 370.

Depending on example embodiments, the memory device 100 may set the reference voltage for the first period of time as the first reference voltage level, for example, the voltage level 350, and divide the first group and second group. Then, the determination unit 120 may reset the reference voltage as the voltage level 360, which may be higher than the first reference voltage level for the second period of time, and update the first group and second group. The determination unit 120 may reset the reference voltage as the voltage level 370, which may be higher than the voltage level 360 for the third period of time, and update the first group and second group.

The determination unit 120 may select any one of the previously defined reference voltage levels. For example, the determination unit 120 may select from the voltage level 350, voltage level 360, and voltage level 370 in FIG. 3. The reference voltage levels may be defined in association with verify voltage levels in advance. The verify voltage levels may be used while the memory device 100 programs data in the memory page 111.

The multi-bit cells of the memory page 111 may be erased before being programmed. The erased multi-bit cells may have an initialized threshold voltage state. It may be assumed that the initialized threshold voltage state is identical to or similar to the threshold voltage state 310.

The memory device 100 may not perform programming with respect to multi-bit cells where the data of "11" is to be stored, when the data of "11" corresponds to the initialized threshold voltage state 310.

The memory device 100 may program data using a first verify voltage level (not illustrated) with respect to the multi-bit cells where the data of "10" is to be stored. The memory device 100 may repeatedly perform a plurality of unit programming operations, and thereby may increase a threshold voltage of multi-bit cells. The memory device 100 may determine whether a threshold voltage of the multi-bit cells, where the data of "10" is to be stored, is higher than the first verify voltage level, every time each of the plurality of unit programming operations is terminated. The memory device 100 may no longer perform the unit programming operation with respect to multi-bit cells with a threshold voltage higher than the first verify voltage level. The memory device 100 may additionally perform the unit programming operation with respect to multi-bit cells with a threshold voltage lower than the first verify voltage level.

The first verify voltage level may be a voltage level forming a lowest limit of the threshold voltage state 320 so that the memory device 100 forms the threshold voltage state 320 corresponding to the data of "10" using the first verify voltage level. The voltage level 350, one of the reference voltage levels which may be selected as a verify voltage by the determination unit 120, may be lower than the first verify voltage level and higher than the threshold voltage state 310. Through such a method, the reference voltage levels may be generated from verify voltage levels used during a program process. In general, the reference voltage levels may be lower than the verify voltage levels by regular amounts. For example, when the verify voltage levels are 1.0 V, 2.0 V, and 3.0 V, the reference voltage levels may be 0.7 V, 1.7 V, and 2.7 V, respectively.

Figure 2:
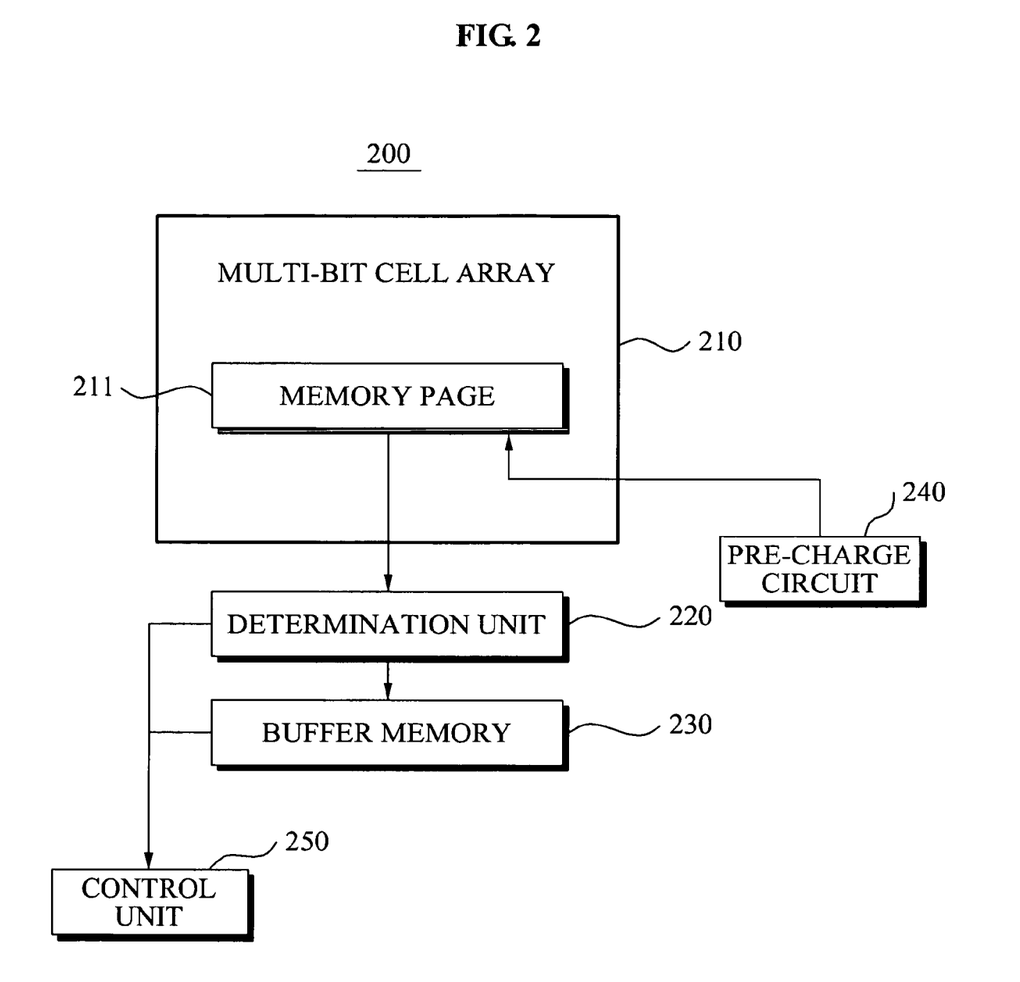
FIG. 2 is another diagram illustrating a memory device according to example embodiments.

Referring to FIGS. 1 and 2, the determination unit 120 may detect a change of threshold voltage of each of the multi-bit cells of the memory page 111 from the group information corresponding to each of the multi-bit cells of the memory page 111. The determination unit 120 may identify data stored in the memory page 111 from the group information. The determination unit 120 may Error Control Codes (ECC) decode the identified data to determine whether the identified data has an error. When the error exists, the determination unit 120 may count a number of errors. Information which may be obtained from the ECC-decoded data by the determination unit 120 may be determined according to an ECC decoding scheme. The determination unit 120 may detect the change of threshold voltage of each of the multi-bit cells of the memory page 111 based on the number of errors of the identified data and error pattern.

For example, it may be assumed that k threshold voltages of the multi-bit cells storing the data of "01" may decrease and become lower than the voltage level 370. The multi-bit cells storing the data of "01" may correspond to the threshold voltage state 340. The determination unit 120 may ascertain that a k number of data of the data of "01" is incorrectly identified as "00" according to a result of the ECC-decoding of the data. The determination unit 120 may extract a proportion of multi-bit cells, which become lower than the voltage level 370 due to the change of the threshold voltage, from the multi-bit cells with the threshold voltage state 340. Also, the determination unit 120 may estimate a change tendency of the threshold voltage of the multi-bit cells from the extracted proportion. The determination unit 120 may use the estimated change tendency of the threshold voltage for the ECC-decoding.

The determination unit 120 may estimate the change tendency of the threshold voltage of the multi-bit cells and control the reference voltage levels. The change tendency of the threshold voltage of the multi-bit cells may be estimated during the read operation, or be previously inputted in a manufacturing process of the memory device 100.

The determination unit 120 may estimate the change tendency of the threshold voltage of the multi-bit cells without additional overhead. In example embodiments, the memory device 100 may not require an additional storage area to estimate the threshold voltage of the multi-bit cells. Also, an additional operation to estimate the change tendency may be reduced.

A mechanism changing the threshold voltage of the multi-bit cells may include a Floating Gate (FG) coupling mechanism, or charge loss mechanism, and the like. The FG coupling mechanism or charge loss mechanism is described in detail with reference to FIG. 4.

Figure 4:
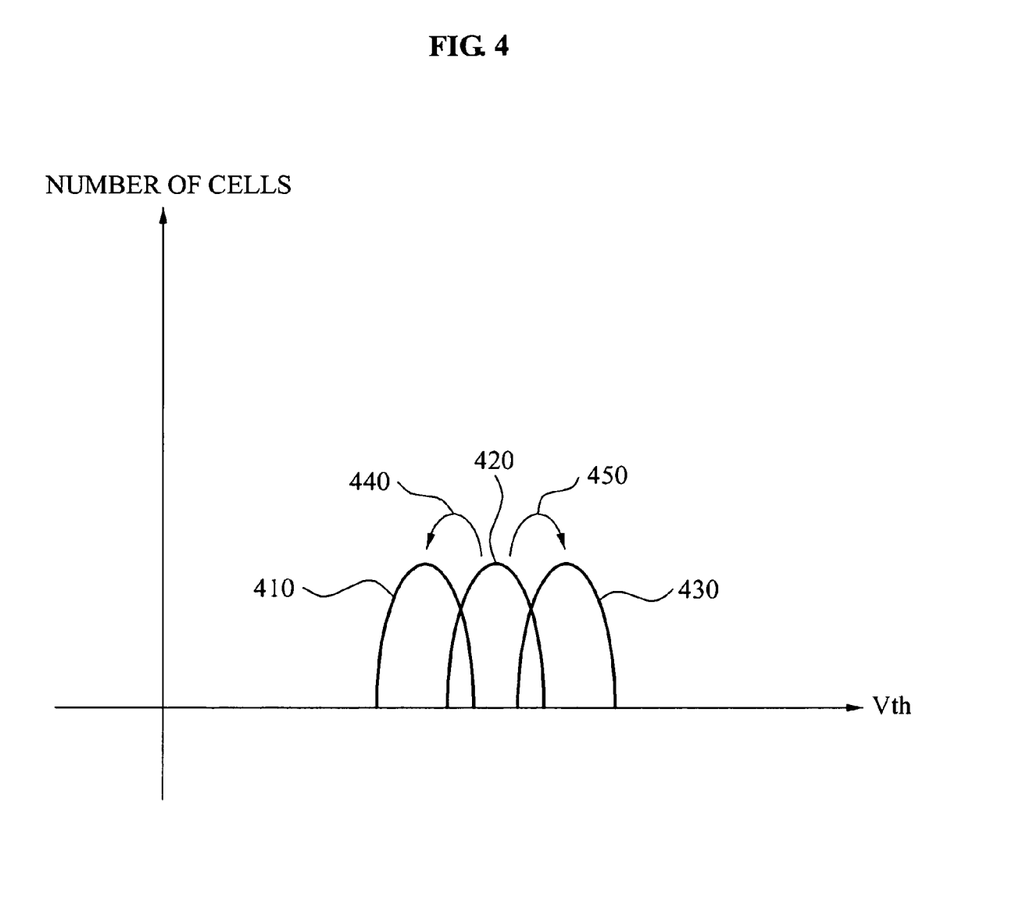
FIG. 4 is a graph illustrating a process of changing a threshold voltage of multi-bit cells according to example embodiments.

FIG. 4 is a graph illustrating a process of changing a threshold voltage of multi-bit cells according to example embodiments.

Referring to FIG. 4, a horizontal axis indicates a threshold voltage of multi-bit cells, and a vertical axis indicates a number of multi-bit cells with a corresponding threshold voltage.

It may be assumed that multi-bit cells have a threshold voltage state 420 after performing a programming operation corresponding to particular data. When the threshold voltages of the multi-bit cells decrease over time, the multi-bit cells may have a threshold voltage state 410. A charge loss mechanism may reduce the threshold voltage of the multi-bit cells.

In general, an insulation layer may be inserted between a Control Gate (CG) and FG in the multi-bit cells. Also, another insulation layer may be inserted between the FG and a substrate. When a voltage is applied on the CG and substrate, and a programming bias condition is satisfied, a charge of the substrate may move to the FG and be electrically charged in the FG. Theoretically, the charge in the FG may not be required to move before satisfying an erase bias condition. In actuality, however, a path where the charge may leak from the FG, due to a defect of the insulation layer around the FG, is formed. The charge loss mechanism may be a mechanism where the charge charged in the FG is discharged via this path. The charge charged in the FG may be discharged over time due to a mechanism such as tunneling as well as this path.

The charge loss mechanism may cause an operation 440 of transiting the multi-bit cells from the threshold voltage state 420 to the threshold voltage state 410.

When the threshold voltages of the multi-bit cells increase over time, the multi-bit cells may have a threshold voltage state 430. For example, the FG coupling mechanism may cause an operation 450 of transiting the multi-bit cells from the threshold voltage state 420 to the threshold voltage state 430.

The FG coupling may refer to a phenomenon where a threshold voltage of center multi-bit cells is affected by a change of a threshold voltage of surrounding multi-bit cells. The threshold voltage of center multi-bit cells may be affected by coupling of a parasitic capacitance among FGs of the multi-bit cells.

When a programming operation increases the threshold voltage of multi-bit cells, the threshold voltage of center multi-bit cells may increase more than a desired value due to the FG coupling.

A distribution of the threshold voltage of multi-bit cells may tend to spread due to the FG coupling, charge loss mechanism, and the like. Since a voltage window where the multi-bit cells are operated may be limited, a possibility where the distribution of the threshold voltage is overlapped increases, as the distribution of the threshold voltage spreads. As the distribution of the threshold voltage increasingly overlaps, an error rate, which may not allow programmed data to be accurately, may increase.

Since the memory device 100 sequentially may determine threshold voltage states from a high threshold voltage state to a low threshold voltage state, or from the low threshold voltage state to the high threshold voltage state, an effect caused by a mapping method between multi-bit data and the threshold voltage state may be reduced. Accordingly, the memory device 100 may select the mapping method between the multi-bit data and the threshold voltage state based on a bit error rate (BER) of each data page.

For example, according to example embodiments, a mapping method where a threshold voltage state 310 corresponds to data of "11", a threshold voltage state 320 corresponds to data of "10", a threshold voltage state 330 corresponds to data of "00", and a threshold voltage state 340 corresponds to data of "01" may be used.

In example embodiments, in the memory device 100, a mapping method which may reduce hardware complexity of the determination unit 120 may be used.

Error control codes (ECC) or error correction codes (ECC) may be applied to the memory device 100 due to an increase in storage density of the memory device 100. The memory device 100 may store data, stored in the multi-bit cells, after ECC-encoding the data. Also, the memory device 100 may ECC-decode data read from the multi-bit cells, and restore the stored data.

The hardware complexity needed to embody an ECC-decoder may increase as an error correcting capability of the ECC-decoder increases. An ECC decoding operation may be performed with respect to each of the data pages. Also, when a BER of a particular data page is considerably higher than a BER of remaining data pages, an ECC decoder with a greater error correcting capability may be required to correct an error of the particular data page. The BER of the particular data page may be controlled not to be too high, in order to reduce the hardware complexity of the ECC decoder.

In example embodiments, the BER of the particular data page may be regulated not to be considerably higher than an average value by controlling a mapping of distribution of threshold voltage and data values. Accordingly, the memory device 100 may reduce the hardware complexity of the ECC decoder included in the memory device 100.

According to example embodiments, in the memory device 100, a mapping method where BERs of all data pages may be controlled to be at a similar level may be used.

According to example embodiments, the memory device 100 may divide threshold voltage states (not illustrated) into a plurality of groups. For example, the memory device 100 may divide the threshold voltage states into a first state group of threshold voltage states with a high threshold voltage and second state group of threshold voltage states with a low threshold voltage. The memory device 100 may perform a read operation with respect to the threshold voltage states included in the second state group, after performing a read operation with respect to the threshold voltage states included in the first state group.

FIG. 2 is another diagram illustrating a memory device 200 according to example embodiments.

Referring to FIG. 2, the memory device 200 may include a multi-bit cell array 210 and a determination unit 220. Also, the memory device 200 may further include a buffer memory 230, a pre-charge circuit 240, and a control unit 250.

The determination unit 220 may divide multi-bit cells of a memory page 211 in the multi-bit cell array 210 into a first group and second group according to a threshold voltage. The first group may include multi-bit cells with a threshold voltage higher than a reference voltage, and the second group may include the multi-bit cells with a threshold voltage lower than the reference voltage.

The determination unit 220 may sequentially update the first group and second group while changing the reference voltage.

The buffer memory 230 may store information about each of the multi-bit cells of the first group and each of the multi-bit cells of the second group. The buffer memory 230 may store information corresponding to an updated first group and updated second group, when the first group and second group are updated.

The buffer memory 230 may store a flag indicating which one of the first group and second group includes each of the multi-bit cells of the memory page 211. The buffer memory 230 may store as many flags as the number of the multi-bit cells.

The pre-charge circuit 240 may pre-charge a bit line of each of the multi-bit cells of the memory page 211. The pre-charge circuit 240 may not perform a pre-charge operation while the determination unit 220 changes the reference voltage and updates the first group and second group.

An operation of pre-charging of the bit line of each of the multi-bit cells of the memory page 211 may electrically charge a parasitic capacitance of each of the bit lines, which may require long period of time. In example embodiments, the pre-charge circuit 240 may not perform a pre-charge operation, while the determination unit 220 changes the reference voltage and compares the threshold voltage of the multi-bit cells and the reference voltage. After performing a single pre-charge operation, the memory device 200 may compare the threshold voltage and the reference voltage, while changing a voltage of a word line connected to the multi-bit cells of the memory page 211. In this instance, the voltage applied to the word line may be determined according to the reference voltage. Since the memory device 200 may reduce a number of times that each of the bit lines is pre-charged, a time for reading data may be reduced to be about the same as a time spent for pre-charging.

The control unit 250 may read information corresponding to the first group and second group. The information may be stored in the buffer memory 230, and indicate which one of the first group and second group includes each of the multi-bit cells. The control unit 250 may re-read the information corresponding to the updated first group and updated second group when the first group and second group are updated, and identify data, stored in the multi-bit cells of the memory page 211, based on the information previously read and/or the re-read information.

An operation of the memory device 200 is described in detail with reference to FIGS. 3 and 5.

An operation of a memory device 200 may be performed in a similar way to that of the memory device 100 shown with FIG. 3.

Figure 5:
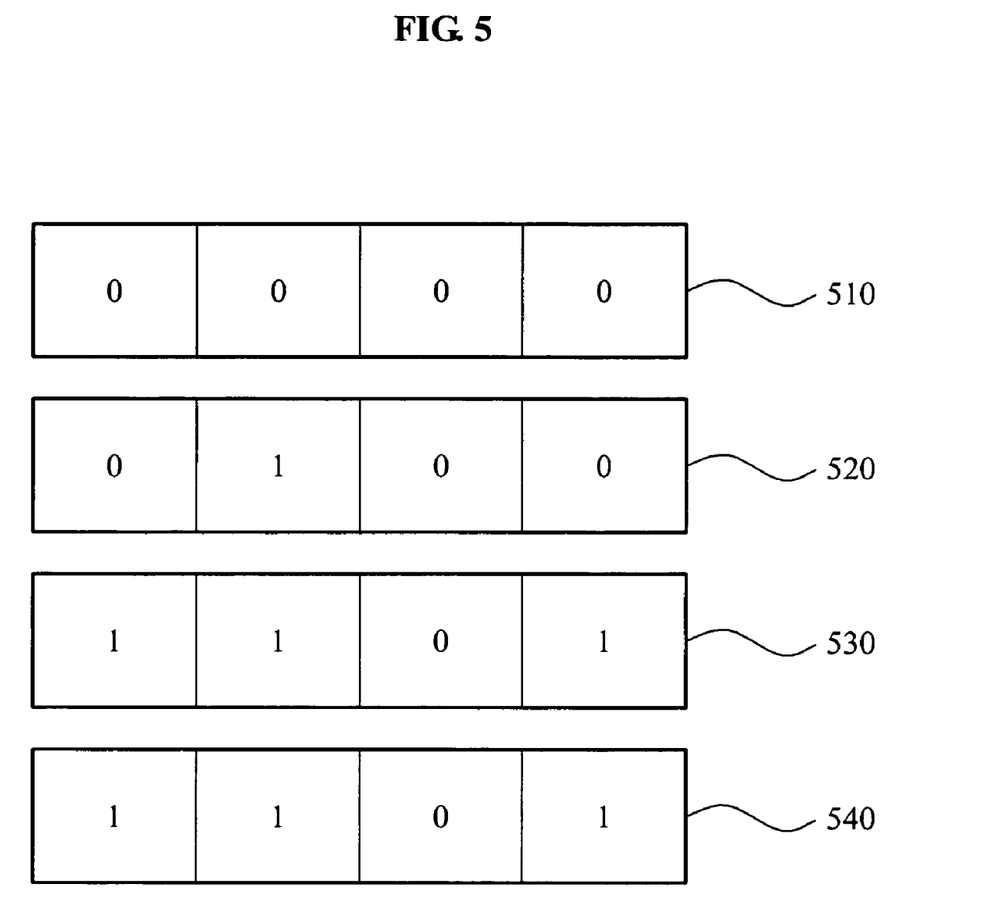
FIG. 5 is a diagram illustrating an example of a flag stored in a buffer memory according to example embodiments.

FIG. 5 is a diagram illustrating an example of a flag stored in a buffer memory according to example embodiments.

Referring to FIG. 5, each row may indicate a flag stored in a buffer memory 230 for an identical period of time, and each column may indicate a change of a flag with respect to an identical multi-bit cell with respect to time.

For convenience of description, a left-most column may refer to a flag with respect to a first multi-bit cell, and other columns following sequentially may refer to flags with respect to a second multi-bit cell, third multi-bit cell, and fourth multi-bit cell, respectively.

A row 510 may indicate a flag of an initialized buffer memory 230. The buffer memory 230 may be initialized as "0000" before starting a read operation of a memory device 200.

A row 520 may indicate a flag stored in the buffer memory 230 for a first period of time. A determination unit 220 may set a voltage level 370 as a reference voltage for the first period of time, and divide multi-bit cells of a memory page 211 into a first group and a second group.

When only the second multi-bit cell is included in the first group for the first period of time, a flag of "0100" may be stored in the buffer memory 230. Since the first group of the first period of time may correspond to a threshold voltage state 340, and the threshold voltage state 340 may correspond to data of "01", a control unit 250 may identify data, stored in the second multi-bit cell, as "01".

A row 530 may indicate a flag stored in the buffer memory 230 for a second period of time. The determination unit 220 may set a voltage level 360 as the reference voltage for the second period of time, and divide the multi-bit cells of the memory page 211 into the first group and second group.

When the first multi-bit cell, second multi-bit cell, and fourth multi-bit cell are included in the first group of the second period of time, and the third multi-bit cell is included in the second group of the second period of time, a flag of "1101" may be stored in the buffer memory 230. The control unit 250 may identify data of the first multi-bit cell and fourth multi-bit cell based on the flag, stored in the buffer memory 230 for the second period of time, and a flag stored in the buffer memory 230 for the first period of time. Since the first multi-bit cell and fourth multi-bit cell may be included in the second group for the first period of time and in the first group for the second period of time, the control unit 250 may ascertain that the first multi-bit cell and fourth multi-bit cell have a threshold voltage state 330. The threshold voltage state 330 may correspond to data of "00", and thus the control unit 250 may identify data, stored in the first multi-bit cell and fourth multi-bit cell, as "00".

A row 540 may indicate a flag stored in the buffer memory 230 for a third period of time. The determination unit 220 may set a voltage level 350 as the reference voltage for the third period of time, and divide the multi-bit cells of the memory page 211 into the first group and second group.

When the first multi-bit cell, second multi-bit cell, and fourth multi-bit cell are included in a first group of the third period of time, and the third multi-bit cell is included in a second group of the third period of time, the flag of "1101" may be stored in the buffer memory 230.

The control unit 250 may identify data, stored in the third multi-bit cell, based on the flag stored in the buffer memory 230 for the third period of time. Since the third multi-bit cell may be included in the second group of the third period of time, the third multi-bit cell may correspond to a threshold voltage level 310, and the threshold voltage level 310 may correspond to data of "11". Accordingly, the control unit 250 may identify the data, stored in the third multi-bit cell, is "11".

The buffer memory 230 may compare the reference voltage and a threshold voltage of multi-bit cell. Also, the buffer memory 230 may store a flag of "1" with respect to a multi-bit cell with a threshold voltage higher than the reference voltage, and store a flag of "0" with respect to a multi-bit cell with a threshold voltage lower than the reference voltage. Accordingly, the buffer memory 230 may be simply configured to store the flag, and the control unit 250 may be complexly configured to identify data.

Figure 6:
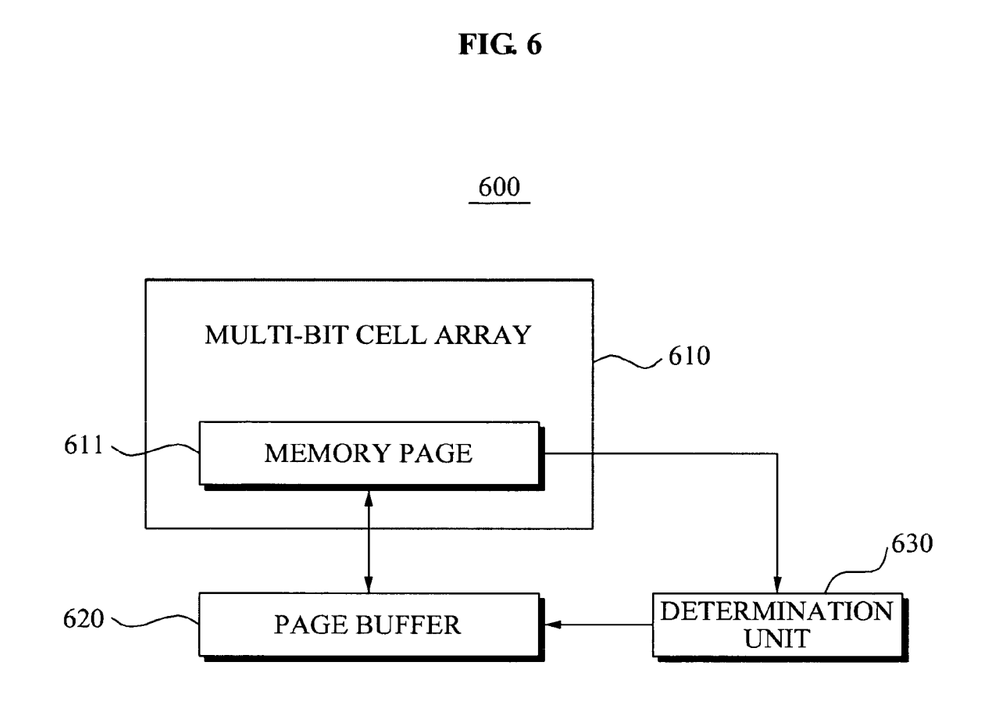
FIG. 6 is a still another diagram illustrating a memory device according to example embodiments.

FIG. 6 is still another diagram illustrating a memory device 600 according to example embodiments.

Referring to FIG. 6, the memory device 600 includes a multi-bit cell array 610, a page buffer 620, and a determination unit 630.

The page buffer 620 may store data to be programmed while a programming of a memory page 611 of the multi-bit cell array 610 is operated.

The determination unit 630 may divide multi-bit cells of the memory page 611 into a first group and second group during a read operation with respect to the memory page 611 of the multi-bit cell array 610. The determination unit 630 may divide the multi-bit cells of the memory page 611 into the first group and second group according to a threshold voltage of the multi-bit cells of the memory page 611. The first group may include multi-bit cells with a threshold voltage higher than a reference voltage, and the second group may include multi-bit cells with a threshold voltage lower than the reference voltage.

The page buffer 620 may store a flag indicating which one of the first group and second group includes each of the multi-bit cells of the memory page 611 during the read operation. The page buffer 620 may erase data, stored while the program is operated, before the read operation is performed.

The determination unit 630 may update the first group and second group while sequentially changing the reference voltage during the read operation. The determination unit 630 may set the reference voltage as a first reference voltage level, and divides the first group and second group according to the set reference voltage, for example, a first reference voltage level. The determination unit 630 may update the first group and second group while sequentially changing the reference voltage to a reference voltage level lower than the first reference voltage level.

Reference voltage levels including the first reference voltage level may be determined in association with verify voltage levels used while the program is operated.

When the first group and second group are updated, the page buffer 620 may fix a flag of each multi-bit cell previously included in the first group, and store a flag corresponding to the updated first group and updated second group with respect to each multi-bit cell previously included in the second group.

The page buffer 620 may store the fixed flag with respect to each of the multi-bit cells included in the first group for the first period of time, for the second period of time and later time periods. In this instance, the fixed flag may have a same value as the stored flag with respect to each of the multi-bit cells included in the first group for the first period of time. Depending on example embodiments, in the memory device 600, the fixed flag may have a different value from each of the multi-bit cells previously included in the first group for the first period of time.

For example, when a flag of "1" with respect to each of the multi-bit cells included in the first group for the first period of time is stored in the page buffer 620, the flag of "1" with respect to each of the multi-bit cells, previously included in the first group for the first period of time, may be stored in the page buffer 620 for the second period of time and later time periods, or a flag of "0" may be fixed and stored.

In example embodiments, where the flag of "1" is stored for the first period of time and the flag of "0" is fixed and stored for the second period of time and later, a host outside of the memory device 600 or a controller (not illustrated) inside of the memory device 600 may identify data, stored in each of the multi-bit cells, using data read from the page buffer 620 at every period of time. The host (not illustrated) may include a computing system. For instance, the page buffer 620 may further include a logic circuit identifying and fixing a flag. Accordingly, hardware complexity of the page buffer 620 may increase, and hardware complexity of the host or controller may decrease.

Example embodiments of the memory device 600 are described in detail with reference to FIGS. 3 and 7.

Although the performance of the determination unit 120 has been described in association with the memory device 100 and the memory device 200 in association with FIG. 3, the memory device 600 may be performed in a similar way to the memory device 100 or the memory device 200.

Figure 7:
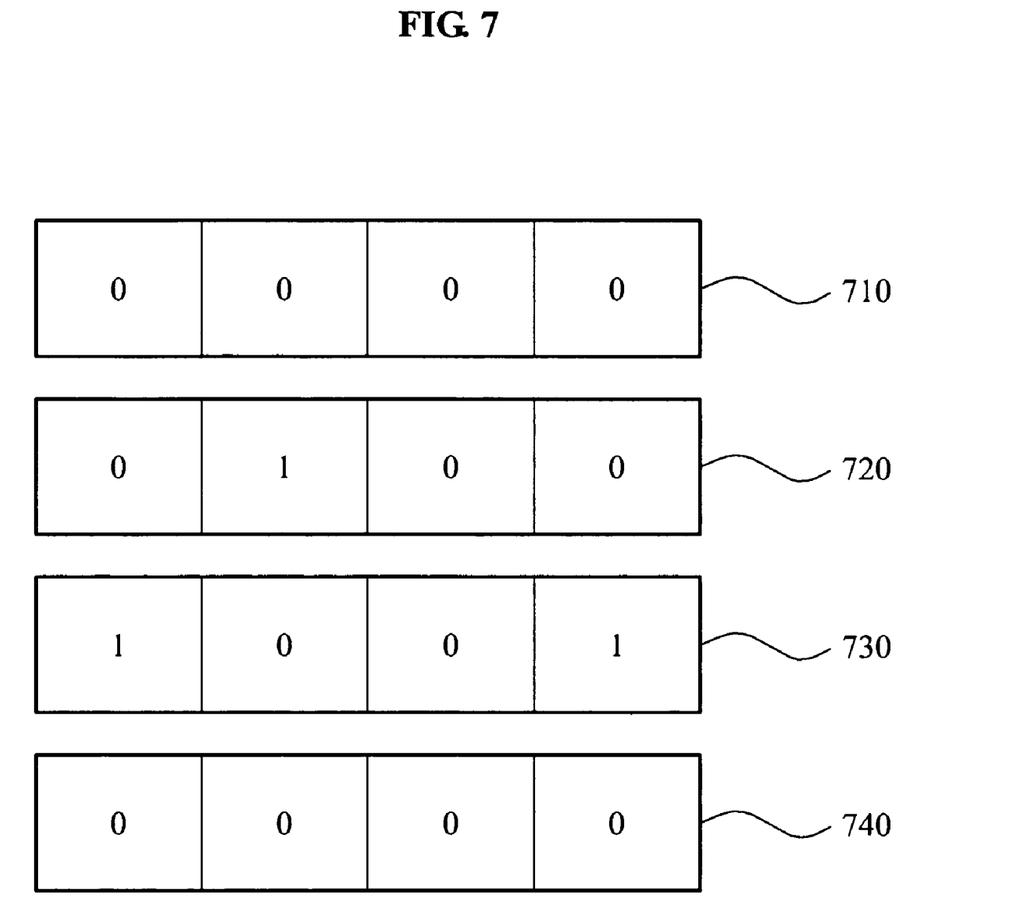
FIG. 7 is another diagram illustrating an example of a flag stored in a buffer memory according to example embodiments.

FIG. 7 is another diagram illustrating an example of a flag stored in a buffer memory according to example embodiments.

Referring to FIG. 7, each row may indicates a flag stored in a page buffer for a same period of time, and each column may indicate a change of a flag with respect to an identical multi-bit cell with respect to time.

For convenience of description, a left-most column may refer to a flag with respect to a first multi-bit cell, and other columns following sequentially may refer to flags with respect to a second multi-bit cell, third multi-bit cell, and fourth multi-bit cell, respectively.

A row 710 may indicate a flag of an initialized page buffer 620. The page buffer 620 may be initialized as "0000" before starting a read operation of a memory device 600.

A row 720 may indicate a flag stored in the page buffer 620 for a first period of time. A determination unit 630 may set a voltage level 370 as a reference voltage for the first period of time, and divide multi-bit cells of a memory page 611 into a first group and a second group.

When only the second multi-bit cell is included in the first group for the first period of time, a flag of "0100" may be stored in the page buffer 620. Since the first group of the first period of time may correspond to a threshold voltage state 340, and the threshold voltage state 340 may correspond to a data of "01", a controller or host (not illustrated) may identify data, stored in the second multi-bit cell, as "01" based on data read from the page buffer 620 for the first period of time. The controller or host may identify data, stored in the second multi-bit cell corresponding to a flag of "1", as "01". The flag of "1" may be stored for the first period of time.

A row 730 may indicate a flag stored in the page buffer 620 for a second period of time. The determination unit 630 may set a voltage level 360 as the reference voltage for the second period of time, and divide the multi-bit cells of the memory page 611 into the first group and second group.

The page buffer 620 may fix a flag corresponding to the second multi-bit cell as "0" from the second period of time and store the flag. The second multi-bit cell may correspond to the flag of "1," which may be stored for the first period of time.

When the first multi-bit cell, second multi-bit cell, and fourth multi-bit cell are included in the first group of the second period of time, and the third multi-bit cell is included in the second group of the second period of time, a flag of "1001" may be stored in the page buffer 620.

The controller or host may identify data, stored in the first multi-bit cell and fourth multi-bit cell, as "00". The first multi-bit cell and fourth multi-bit cell may correspond to the flag of "1," which may be stored for the second period of time.

Since a threshold voltage of the first multi-bit cell and fourth multi-bit cell is lower than the voltage level 370 and higher than the voltage level 360, the first multi-bit cell and fourth multi-bit cell may have a threshold voltage state 330. The threshold voltage state 330 may correspond to data of "00", and thus the memory device 600 may accurately identify the data stored in the first multi-bit cell and fourth multi-bit cell.

A row 740 may indicate a flag stored in the page buffer 620 for a third period of time. The determination unit 630 may set a voltage level 350 as the reference voltage for the third period of time, and divide the multi-bit cells of the memory page 611 into the first group and second group.

The page buffer 620 may fix and store a flag corresponding to the second multi-bit cell as "0" from the second period of time. Also, the page buffer 620 may fix and store flags corresponding to the first multi-bit cell and fourth multi-bit cell as "0" for the third period of time. The first multi-bit cell and fourth multi-bit cell may correspond to the flag of "1" which is stored for the second period of time.

When the first multi-bit cell, second multi-bit cell, and fourth multi-bit cell are included in the first group of the third period of time, and the third multi-bit cell is included in the second group of the third period of time, a flag of "0000" may be stored in the page buffer 230.

Data identification may be performed for the first period of time and second period of time with respect to the first multi-bit cell, second multi-bit cell, and fourth multi-bit cell corresponding to the flag of "1". Accordingly, the controller or host may identify data stored in the third multi-bit cell for the third period of time. The flag of "1" may be stored in the page buffer 620 for the first period of time or second period of time.

Since the third multi-bit cell may be included in the second group of the third period of time, the third multi-bit cell may correspond to a threshold voltage state 310. Also, the threshold voltage state 310 may correspond to data of "11". Accordingly, the controller or host may identify data, stored in the third multi-bit cell, as "11".

The page buffer 620 may compare the reference voltage and a threshold voltage of multi-bit cell. Also, the page buffer 620 may store a flag of "1" with respect to a multi-bit cell with a threshold voltage higher than the reference voltage, and store a flag of "0" with respect to a multi-bit cell with a threshold voltage lower than the reference voltage. Also, the page buffer 620 may fix and store the flag of "0" with respect to a multi-bit cell corresponding to the flag of "1" stored for a previous period of time, after a subsequent period of time. The page buffer 620 may determine a flag stored for a current period of time, based on a flag of the previous period of time and a determination result of the determination unit 630.

Accordingly, the page buffer 630 may be relatively complexly configured. Also, the controller or host may be relatively simply configured since the controller or host may identify the data stored in the multi-bit cell based on the data read from the page buffer 630 for the current period of time.

Referring again to FIG. 6, the determination unit 630 sequentially may update the first group and second group while changing the reference voltage during the read operation. The determination unit 630 may set the reference voltage as a second reference voltage level, and divide the first group and second group according to the set reference value which is the second reference voltage level. The determination unit 630 may sequentially update the first group and second group while changing the reference voltage to a reference voltage level higher than the second reference voltage level.

Reference voltage levels including the second reference voltage level may be determined in association with verify voltage levels used while the program is operated.

When the first group and second group are updated, the page buffer 620 may fix a flag of each multi-bit cell previously included in the second group, and store a flag corresponding to the updated first group and updated second group with respect to each multi-bit cell previously included in the first group.

The page buffer 620 may store the fixed flag with respect to each of the multi-bit cells included in the second group for the first period of time, for the second period of time and later periods of time. In this instance, the fixed flag may not have a same value as the stored flag with respect to each of the multi-bit cells previously included in the second group for the first period of time. In example embodiments, in the memory device 600, the fixed flag may have a different value from each of the multi-bit cells included in the second group for the first period of time.

For example, when a flag of "1" with respect to each of the multi-bit cells, previously included in the second group for the first period of time, is stored in the page buffer 620, the flag of "1" with respect to each of the multi-bit cells, included in the second group for the first period of time previously, may be fixed and stored in the page buffer 620 for the second period of time and later periods of time, or a flag of "0" may be fixed and stored.

Figure 8:
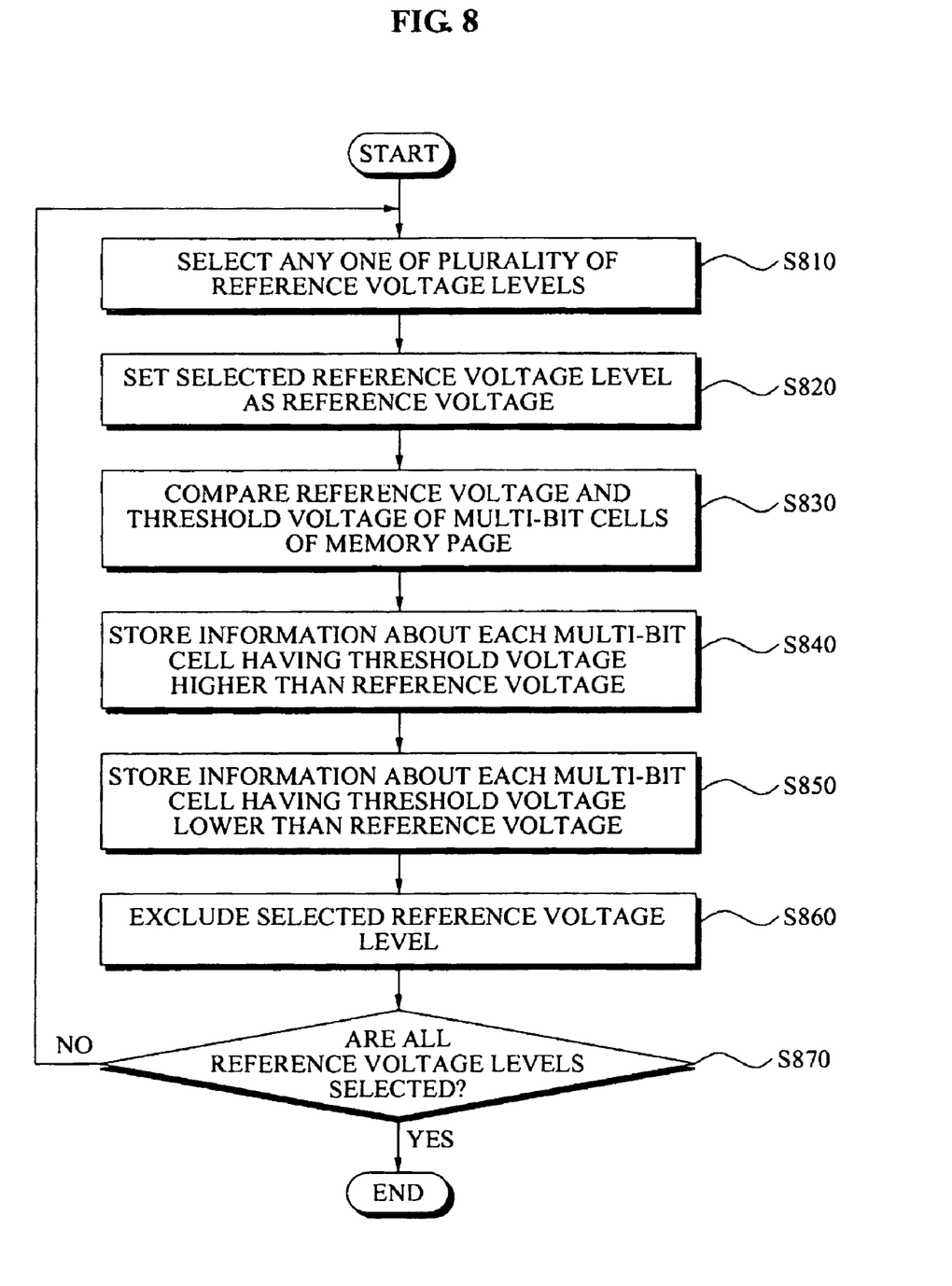
FIG. 8 is a flowchart illustrating a method of reading multi-bit data stored in a memory page of a multi-bit cell array according to example embodiments.

FIG. 8 is a flowchart illustrating a method of reading multi-bit data stored in a memory page of a multi-bit cell array according to example embodiments.

Referring to FIG. 8, in operation S810, the method selects any one of a plurality of reference voltage levels.

In operation S820, the method sets the selected reference voltage level as a reference voltage.

In operation S830, the method compares the reference voltage and a threshold voltage of multi-bit cells of a memory page.

In operation S840, the method stores information about each multi-bit cell having a threshold voltage higher than the reference voltage.

In operation S850, the method stores information about each multi-bit cell having a threshold voltage lower than the reference voltage.

In operation S860, the method excludes the selected reference voltage level.

In operation S870, the method determines whether all reference voltage levels are selected.

When all the reference voltage levels are not selected, the method returns to operation S810. In operation S810, the method selects any one of a plurality of remaining reference voltage levels.

The method repeats operations S810 through S870 until all the reference voltage levels are selected.

Before selecting in operation S810, the method may pre-charge a bit line of each of the multi-bit cells of the memory page.

The method may not perform the pre-charge operation while repeatedly performing the selecting in operation S810 via the determining in operation S870.

The method of reading multi-bit data stored in a multi-bit cell array according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a main controller, and a flash memory device. The flash memory device may store N-bit data via the main controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The main controller and the flash memory device may constitute a solid state drive/disk (SSD) that uses a non-volatile memory to store data.

While example embodiments have been particularly shown and described, it will be understood by those of ordinary skill in the art that various changes in form and details may be made therein without departing from the spirit and scope of example embodiments as defined by the following claims.

What is claimed is:

1. A memory device comprising:
   a multi-bit cell array including at least one memory page with each memory page including a plurality of multi-bit cells; and
   a determination unit that divides the plurality of multi-bit cells into a first group and second group, the first group including multi-bit cells with a threshold voltage higher than a reference voltage, and the second group including multi-bit cells with a threshold voltage lower than the reference voltage,
   wherein the determination unit sequentially updates the first group and second group while changing the reference voltage.

2. The memory device of claim 1, further comprising:
   a buffer memory that stores information about each of the multi-bit cells of the first group and each of the multi-bit cells of the second group,
   wherein the buffer memory stores information corresponding to the updated first group and updated second group, when the first group and second group are updated.

3. The memory device of claim 2, wherein the determination unit detects a change of the threshold voltage of the multi-bit cells of the memory page based on the information stored in the buffer memory.

4. The memory device of claim 2, wherein the buffer memory stores a flag indicating which one of the first group and second group includes each of the multi-bit cells of the memory page.

5. The memory device of claim 2, further comprising:
a control unit that reads the information stored in the buffer memory and re-reads the information corresponding to the updated first group and updated second group when the first group and second group are updated,
wherein the control unit identifies data stored in the multi-bit cells of the memory page based on the read information and the re-read information.

6. The memory device of claim 1, wherein, after setting the reference voltage as a first reference voltage level and dividing the first group and second group, the determination unit updates the first group and second group while sequentially changing the reference voltage to another reference voltage level lower than the first reference voltage level.

7. The memory device of claim 1, wherein, after setting the reference voltage as a first reference voltage level and dividing the first group and second group, the determination unit updates the first group and second group while sequentially changing the reference voltage to another reference voltage level higher than the first reference voltage level.

8. The memory device of claim 1, further comprising:
a pre-charge circuit that pre-charges a bit line of each of the multi-bit cells of the memory page,
wherein the pre-charge circuit does not perform a pre-charge operation while the determination unit changes the reference voltage and updates the first group and second group.

9. The memory device of claim 1, wherein the determination unit controls a voltage level of the reference voltage based on at least one of a floating gate mechanism and charge loss mechanism.

10. The memory device of claim 1, further comprising:
a page buffer that stores data to be programmed while a program of a memory page of the multi-bit cell array is operated,
wherein the determination unit divides the plurality of multi-bit cells of the memory page into the first group and the second group during a read operation with respect to the memory page of the multi-bit cell array,
wherein the determination unit updates the first group and second group while sequentially changing the reference voltage during the read operation, and
wherein the page buffer stores a flag indicating which one of the first group and second group includes each of the multi-bit cells of the memory page.

11. The memory device of claim 10, wherein, after setting the reference voltage as a first reference voltage level and dividing the first group and second group, the determination unit updates the first group and second group while sequentially changing the reference voltage to a reference voltage level lower than the first reference voltage level.

12. The memory device of claim 11, wherein, when the first group and second group are updated, the page buffer fixes a flag of each multi-bit cell previously included in the first group, and stores a flag corresponding to the updated first group and updated second group with respect to each multi-bit cell previously included in the second group.

13. The memory device of claim 10, wherein, after setting the reference voltage as a second reference voltage level and dividing the first group and second group, the determination unit updates the first group and second group while sequentially changing the reference voltage to a reference voltage level higher than the second reference voltage level.

14. The memory device of claim 13, wherein, when the first group and second group are updated, the page buffer fixes a flag of each multi-bit cell previously included in the second group, and stores a flag corresponding to the updated first group and updated second group with respect to each multi-bit cell previously included in the first group.

15. A method of reading multi-bit data stored in a multi-bit cell array, the method comprising:
selecting any one of a plurality of reference voltage levels;
setting the selected reference voltage level as a reference voltage;
comparing the reference voltage and a threshold voltage of a plurality of multi-bit cells of a memory page in the multi-bit cell array;
storing information about each multi-bit cell having a threshold voltage higher than the reference voltage; and
storing information about each multi-bit cell having a threshold voltage lower than the reference voltage,
wherein the selecting, setting, comparing, and storing are repeated until all reference voltage levels are selected.

16. The method of claim 15, wherein the setting selects any one of the remaining reference voltage levels excluding the selected reference voltage level after the comparing.

17. The method of claim 15, wherein the storing sets the selected reference voltage as a new reference voltage.

18. The method of claim 15, further comprising:
pre-charging a bit line of each of the multi-bit cells of the memory page before the selecting, setting, comparing, and storing.

19. A computer-readable medium storing a program for reading multi-bit data stored in a multi-bit cell array, which when executed on the multi-bit cell array, cause the program to implement the method of claim 15.

* * * * *